(12) United States Patent
Plessing et al.

(10) Patent No.: US 6,369,316 B1
(45) Date of Patent: Apr. 9, 2002

(54) PHOTOVOLTAIC MODULE AND METHOD FOR PRODUCING SAME

(75) Inventors: Albert Plessing, Brunn (AT); Horst-Christian Langowski, Zolling; Ulrich Moosheimer, Hohenkammer, both of (DE)

(73) Assignees: Isovolta Österreichische Isolierstoffwerke Aktiengesellschaft, Wiener Neudorf (AT); Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/485,682
(22) PCT Filed: Jun. 30, 1999
(86) PCT No.: PCT/EP99/04505
§ 371 Date: May 26, 2000
§ 102(e) Date: May 26, 2000
(87) PCT Pub. No.: WO00/02257
PCT Pub. Date: Jan. 13, 2000

(30) Foreign Application Priority Data

Jul. 3, 1998 (EP) ............................................. 98112319

(51) Int. Cl.⁷ ........................ H01L 31/048; B32B 31/00
(52) U.S. Cl. ...................... 136/251; 136/244; 136/256; 136/259; 257/433; 438/64; 438/66; 438/85; 156/285
(58) Field of Search ................................. 136/244, 251, 136/256, 259; 257/433; 438/64, 66, 85; 156/285

(56) References Cited

U.S. PATENT DOCUMENTS

| | | | |
|---|---|---|---|
| 4,433,200 A | 2/1984 | Jester et al. | 136/251 |
| 5,593,532 A | * 1/1997 | Falk et al. | 156/285 |

FOREIGN PATENT DOCUMENTS

| | | | |
|---|---|---|---|
| DE | 19611410 C1 | * 8/1997 | |
| DE | 19611410 | 8/1997 | |
| JP | 7-74378 | * 3/1995 | |
| JP | 10-25357 | * 1/1998 | |
| WO | 92/06847 | 4/1992 | |
| WO | 94/29106 | 12/1994 | |
| WO | 9736334 | 10/1997 | |
| WO | WO 97/36334 | * 10/1997 | |

OTHER PUBLICATIONS

Patent Abstracts of Japan, abstract for JP 7–74378, Mar. 1995.
Patent Abstracts of Japan, abstract for JP 10–25357, Jan. 1998.

* cited by examiner

*Primary Examiner*—Alan Diamond
(74) *Attorney, Agent, or Firm*—Bacon & Thomas

(57) ABSTRACT

A description is given of a photovoltaic module (1) in the form of a laminate, which as the core layer exhibits a solar cell system (2) and encapsulation materials (3, 3') applied on both sides of the latter. According to the invention, at least one encapsulation material layer (3') consists of a sealing layer (4') and a barrier layer (6), which consists of a plastic film or a plastic film composite, and on which an inorganic oxide layer (7) separated out to the vapor phase is present.

12 Claims, 4 Drawing Sheets

PHOTOVOLTAIC MODULE AND METHOD FOR PRODUCING SAME

The invention relates to a photovoltaic module in the form of a laminate, which exhibits a solar cell system along with encapsulation materials provided for it. A procedure for its manufacture is also disclosed according to the invention.

PRIOR OF THE ART

Photovoltaic modules are used for generating electrical energy from sunlight. The energy is generated via the solar cell system, which preferably consists of silicon cells. However, these can only carry a slight mechanical load, so that they must be enveloped on either side by encapsulation materials. Encapsulation materials can be one or more layers of glass and/or plastic films and/or plastic film composites.

Plastic film composites essentially comprised of polyvinyl fluoride (PVF) and polyethylene terephthalate (PET) are produced by the applicant under the designation ICOSOLAR, and used to manufacture photovoltaic modules in a vacuum-lamination procedure disclosed in WO-A1-94/29106. In these modules, the solar cell system is protected not only against mechanical damage, but also against exposure to the elements, in particular water vapor. An intermediate layer made out of aluminum is provided in the ICOSOLAR film composite as a barrier layer against water vapor. However, the disadvantage to this layer is that it is electrically conductive in conjunction with the solar cell system, so that undesired outside currents in the photovoltaic module come about.

DESCRIPTION OF THE INVENTION

Therefore, the object of the invention is to provide a photovoltaic module of the kind mentioned at the outset which does not exhibit this shortcoming, but is largely impermeable to water vapor.

This object is achieved according to the invention by means of a proposed photovoltaic module, characterized by the fact that at least one encapsulation material layer consists of a sealing and barrier layer, and that the barrier layer is made out of a plastic film or a plastic film composite, which is provided on the side facing the solar cell system with an inorganic oxide layer separated out of the vapor phase.

Another advantage to the photovoltaic module according to the invention is that the inorganic oxide layer consists of the elements aluminum or silicon, and is present in a thickness of 30 to 200 nm. The organic oxide layer also exhibits the advantage that it is permeable to light beams in the visible light wave range and near UV wavelength range, while it absorbs them at shorter wavelengths in the UV wavelength range.

The photovoltaic module according to the invention also exhibits the advantage that the sealing layer is arranged between the solar cell system and the barrier layer, and preferably consists of ethylene vinyl acetate (EVA) or ionomers.

According to the invention, the plastic film on which the inorganic oxide layer is deposited additionally consists of polyethylene terephthalate (PET) or ethylene tetrafluoroethylene copolymer (ETFE).

Other advantages of the photovoltaic module according to the invention are that the inorganic oxide layer faces the solar cell system, and contacts the adjacent sealing layer directly or via a primer coat.

In addition, the inorganic oxide layer is enveloped by plastic films or composites on both sides according to the invention, wherein at least one plastic film or one plastic film composite acts as the barrier layer. In this case, the inorganic oxide layer advantageously contacts the plastic films or composites via an adhesive layer and/or a hybrid layer comprised of organic/inorganic networks.

According to the invention, the inorganic oxide layer consists of SiOx, wherein the atomic ratio of silicon to oxygen x lies within a range of 1.3–1.7.

The invention also relates to a procedure for manufacturing a photovoltaic module, wherein it is beneficial for:

a) a plastic film or plastic film composite to be provided with an inorganic oxide layer separated out of the vapor phase, b) a module stack comprised of the solar cell system and encapsulation materials to be layered in such a way that the sealing layers envelop the solar cell system on both sides, c) this module stack to be incorporated into a loading station of a process arrangement in which it is kept at a temperature below the distortion temperature of the sealing layers, d) the module stack to be transported to a vacuum laminator in this arrangement, which is evacuated, and in which the module stack is heated to the distortion temperature of the sealing layers, and e) the composite formed out of the module stack, after ventilating the vacuum laminator without recooling, to be transported to a hardening furnace, in which the sealing layers are hardened, so that a laminate is formed as a photovoltaic module, which can be removed from the continuous process after recooling.

BRIEF DESCRIPTION OF DRAWINGS

The invention will now be described based on FIGS. 1 to 4.

ONE WAY TO PERFORM THE INVENTION

Figure 1:
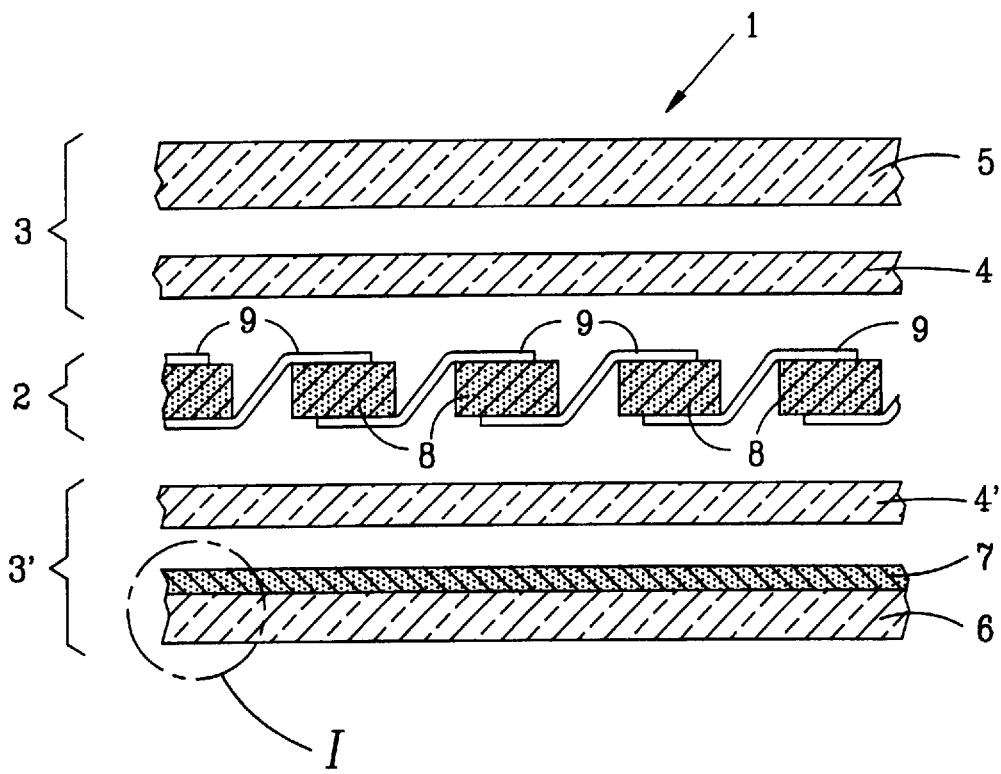
FIG. 1 shows the structure of the photovoltaic module 1 according to the invention, which mainly consists of the solar cell system 2 and the encapsulation materials 3, 3' enveloping the solar cell systems.

The invention will now be described in more detail based on embodiments and on FIGS. 1 to 4. As shown in FIG. 1 the solar system 2 is made out of a series of silicon cells 8, which are soldered in series to form groups by means of bonding wires 9. The encapsulation material 3' consists of the plastic sealing layer 4' and the plastic film or plastic film composite 6, which exhibits the oxide layer 7 separated out of the vapor phase on the surface facing the solar cell system 2. This layer structure is designated with I. The encapsulation material 3 can be made out of layer 5, for example, which can be a glass layer or plastic film composite similar to 6, and a plastic sealing layer 4.

Figure 1A:
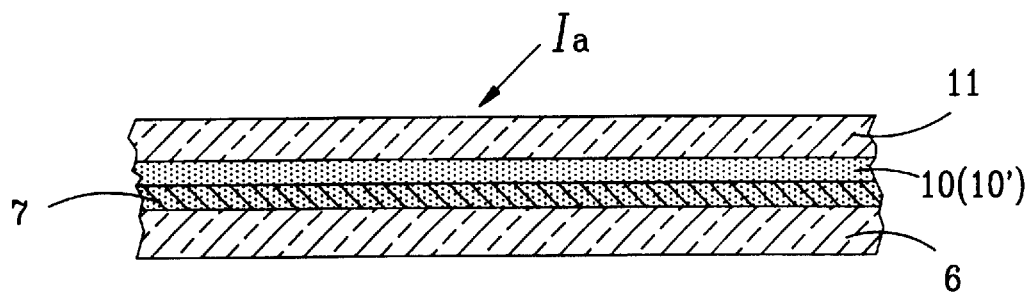
FIGS. 1a and 1b show variants Ia and Ib of the layer structure I in FIG. 1.
Figure 1B:
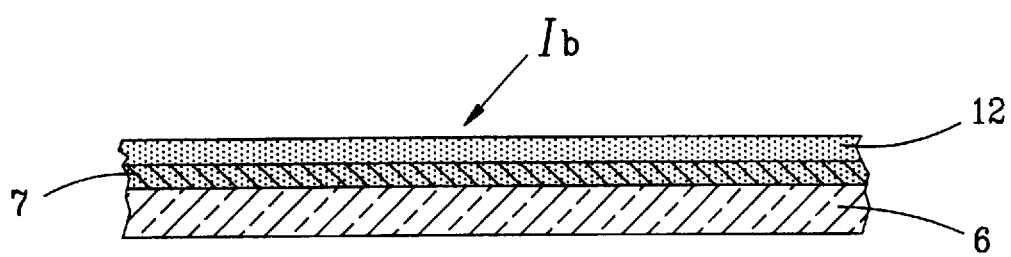

FIGS. 1a and 1b additionally show variants Ia and Ib, which can replace the layer structure according to I.

In variant Ia (FIG. 1a), the inorganic oxide layer 7 is connected with an additional plastic film or plastic film composite 11 via an adhesive layer 10 and/or a hybrid layer comprised of organic/inorganic networks.

In variant Ib (FIG. 1b), the inorganic oxide layer 7 exhibits an additional primer layer 12, which as a result establishes the connection to the sealing layer for prime.

In a first procedural step, the barrier layer 6 exhibiting the inorganic oxide layer 7 is formed. In this case, the structure can be selected based on the following table, with the sequence running from the outside in, i.e., in the direction of the solar cell system:

TABLE (Examples a–d)

Example a
  Barrier layer 6: Composite comprised of polyvinyl fluoride (PVF), polyethylene terephthalate (PETP) in film form
  Inorganic oxide layer 7: SiOx or Al2O3
  Sealing layer 4'
Example b
  Barrier layer 6: Plastic film comprised of ethylene tetrafluoroethylene copolymer (ETFE)
  Inorganic oxide layer 7: SiOx or Al2O3
  Sealing layer 4'
Example c
  Barrier layer 6: Composite comprised of PVF and PETP
  Inorganic oxide layer 7: SiOx or Al2O3
  Hybrid layer comprised of organic/inorganic networks 10'
  Adhesive layer 10: e.g., polyurethane
  Plastic film or plastic film composite 11: Polyvinyl fluoride (PVF), polyvinylidene fluoride (PVDF), Ethylene tetrafluoroethylene copolymer (ETFE), Poyethylene terephthalate (PETP)
  Sealing layer 4'
Example d
  Barrier layer 6: Composite comprised of PVF and PETP
  Inorganic oxide layer 7: SiOx or Al2O3
  Primer coat 12: e.g., polyurethane, ethylene vinyl acetate (EVA), polymethyl methacrylate (PMMA)
  Sealing layer 4'

As evident from the table, the barrier layer 6 can consist of a single plastic film according to Example b), and of a plastic film composite according to Example a).

Preferably used as the sealing layers 4' are ethylene vinyl acetate (EVA) films, which yield slightly during heat treatment, as a result of which they become cross-linked, which prevents the plastics from creeping.

Ionomers exhibit particularly good sealing properties. These are polymers with ionic groups, which have a low water vapor permeability in addition to good adhesive properties.

The inorganic oxide layer 7 is now generated on the PETP plastic film (see Example a) per table) in a thickness of 30 to 200 nm through vapor separation under a vacuum (not shown). A vacuum coating system (not shown) is used to this end, for example. To ensure a satisfactory adhesion between the plastic film surface and the inorganic oxide, the surface of the plastic film is pretreated in a plasma consisting of oxygen gas (99.995% purity).

Stoichiometric quantities of aluminum oxide (99.9% purity) or silicon monoxide (99.9% purity) are used as the coating material, for example, and evaporated using electron beams under a vacuum. The energy used during evaporation measured 10 keV, for example, at an emission rate of up to 220 mA. The thickness of the SiOx or Al2O3 layers can be set within a range of 30 to 200 nm by varying the evaporation rate or speed of the plastic films or plastic film composites moved via rollers.

For example, a speed of 5 m/min is selected in the laboratory for fabricating a 100 nm thick SiOx layer, while a speed of 2.5 m/min must be selected to manufacture a 40 nm thick Al2O3 layer. The evaporation rate here measured up to 70 nm/s; the pressure used during evaporation was about $5 \times 10^{-2}$ Pa. During industrial manufacture, speeds of 100 times or more faster can be set.

The plastic film provided with the inorganic oxide layer, for example made out of PET, can now be laminated with the other plastic film for manufacturing the plastic film composite, for example made out of PVF (see Example a) per table).

The variants of the invention according to Examples a) and b) now envisage that the inorganic oxide layer 7, preferably a silicon oxide layer, be in direct contact with sealing layer 4', which ensures a satisfactory coupling. In this case, the atomic ratio between silicon and oxygen can be varied as desired.

However, if the inorganic oxide layer, preferably the silicon/oxide layer, in the photovoltaic module according to the invention is intended to additionally ensure a UV filtering effect, it is necessary to control the atomic ratio of silicon to oxygen during evaporation in such a way that the share of oxygen x lies between 1.3 and 1.7.

In addition to the above criteria, e.g., selection of the starting products in a stoichiometric quantity ratio or evaporation speed, this can also be accomplished by additionally supplying oxygen in the form of a reactive gas during evaporation. This gives rise to a highly transparent oxide layer in the visible light wave range, which still absorbs UV rays, so that the UV-sensitive sealing layers 4' are also protected.

Figure 3:
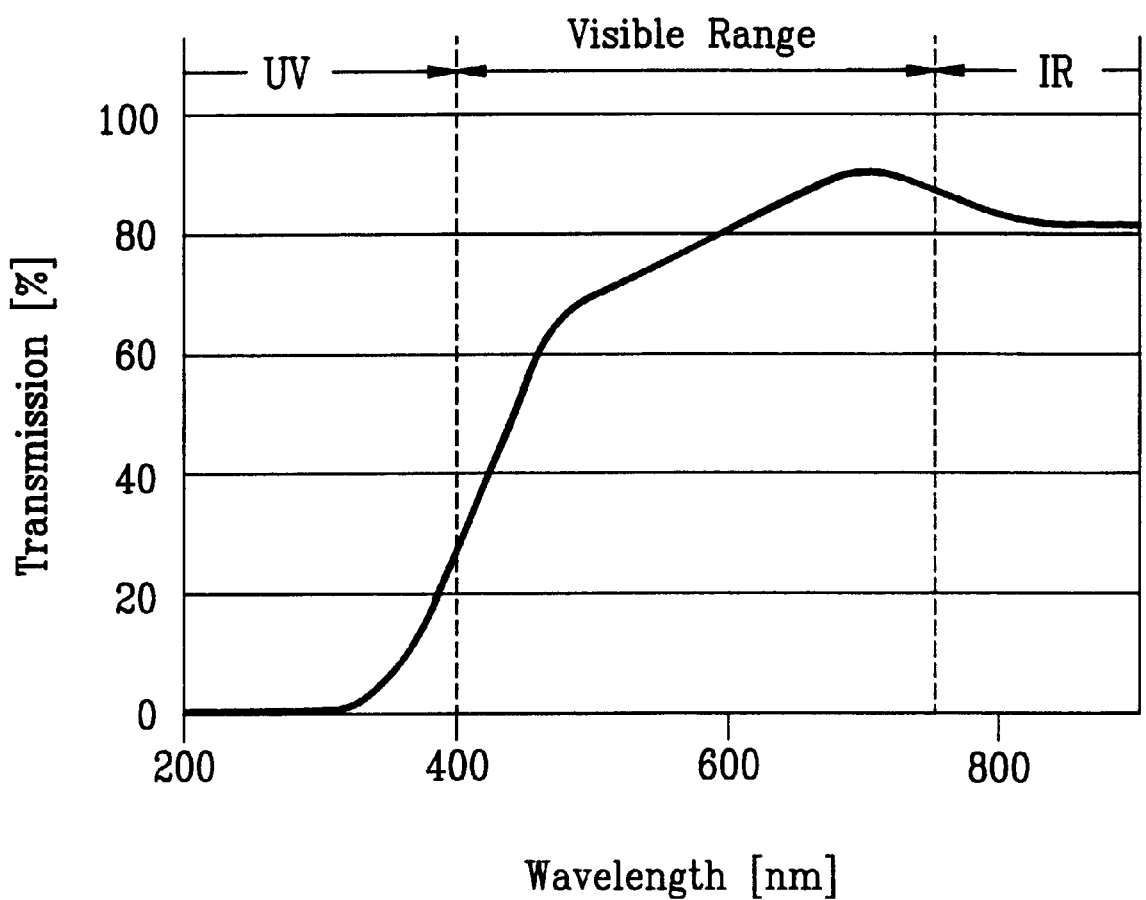
FIG. 3 shows the light permeability in different wavelength ranges of a plastic film vapor-plated with an inorganic oxide layer, which is provided within the encapsulating materials 3, 3'.

This is explained in greater detail in FIG. 3.

FIG. 3 shows the light permeability of an ETFE plastic film, which exhibits a 320 nm thick SiOx layer as the inorganic oxide layer. This makes it evident that the SiOx coated plastic film is practically impermeable to light in the UV range below 350 nm light wavelength. An uncoated plastic film of the same constitution (not shown) would not absorb light in this range, however. Starting at a light wavelength of 350 nm, the ETFE film coated with SiOx starts to let the incident light through. A significant transparence can be observed starting at about 450 nm in the blue-violet portion of the spectrum of visible light. A high transmission is observed over the remaining visible light range, which only diminishes again in the infrared range.

The following degrees of freedom are available to obtain properties of the photovoltaic module according to the invention, such as high light transmission in the visible and near-UV range given a simultaneous blockage of light in the shorter-wave UV range, and also a high barrier effect against water vapor:

1. Variation of inorganic oxide layer thickness:

In this case, light permeability can be advantageously influenced in good approximation according to the Lambert-Beer's Law $$\ln(I/IO) = -4\pi k dl^{-1}$$

where
- I=light intensity allowed through
- IO=radiated intensity,
- k=wavelength-dependent absorption coefficient,
- d=layer thickness of vapor-deposited inorganic oxide layer,
- λ=light wavelength.

2. Variation of oxygen content (x) in the inorganic oxide layer, preferably SiOx layer:

If x is increased from the value of 1.3 according to FIG. 3 using other vapor-deposition conditions, the transmission of the material will be higher by the wavelength range of 400 nm without having to change the layer thickness.

Values for x of 1.7, for example, can be set by adding oxygen while simultaneously incorporating electromagnetic energy in the form of microwave radiation.

Therefore, varying the layer thickness and oxygen content parameters enable the simultaneous optimization of values for transmission in the visible light range, the barrier effect in the ultraviolet range, and the barrier effect relative to water vapor.

In addition to the selective atomic ratio of silicon to oxygen, resistance to atmospheric corrosion during outside use of the photovoltaic module according to the invention is also ensured by enveloping the inorganic oxide layer 7 on both sides with plastic films or plastic film composites.

In FIG. 1, variant Ia, for example, this is done by having the barrier layer 6 exhibit the inorganic layer 7, which in turn is in contact with another plastic film or plastic film composite 11 via adhesive layer 10. In this case, adhesive layer 10 can be provided alone or in combination with a layer 10' comprised of hybrid layers of inorganic/organic networks. These networks are inorganic/organic hybrid systems based on alkoxy siloxanes, for example. They exhibit a close crosslink density, and hence a high barrier effect relative to water vapor, and at the same time adhere satisfactorily to the SiOx layer.

Further, the plastic films according to Example c) can be correspondingly selected from the table, so that they additionally act to protect the solar cell system against exposure to the elements. In this case, the arrangement for the solar cell system according to FIG. 1/Ia can also be selected in such a way that the barrier layer 6 is adjacent to the sealing layer 4', while the plastic film or plastic film composite 11 forms the outermost layer in the module stack.

In addition, it is also possible to bring about a satisfactory resistance to atmospheric corrosion using a primer coat 12 made out of plastic, which is arranged between the sealing layer 4' and the inorganic oxide layer 7 according to FIG. 1/variant Ib and Example d) from the table.

Figure 2:
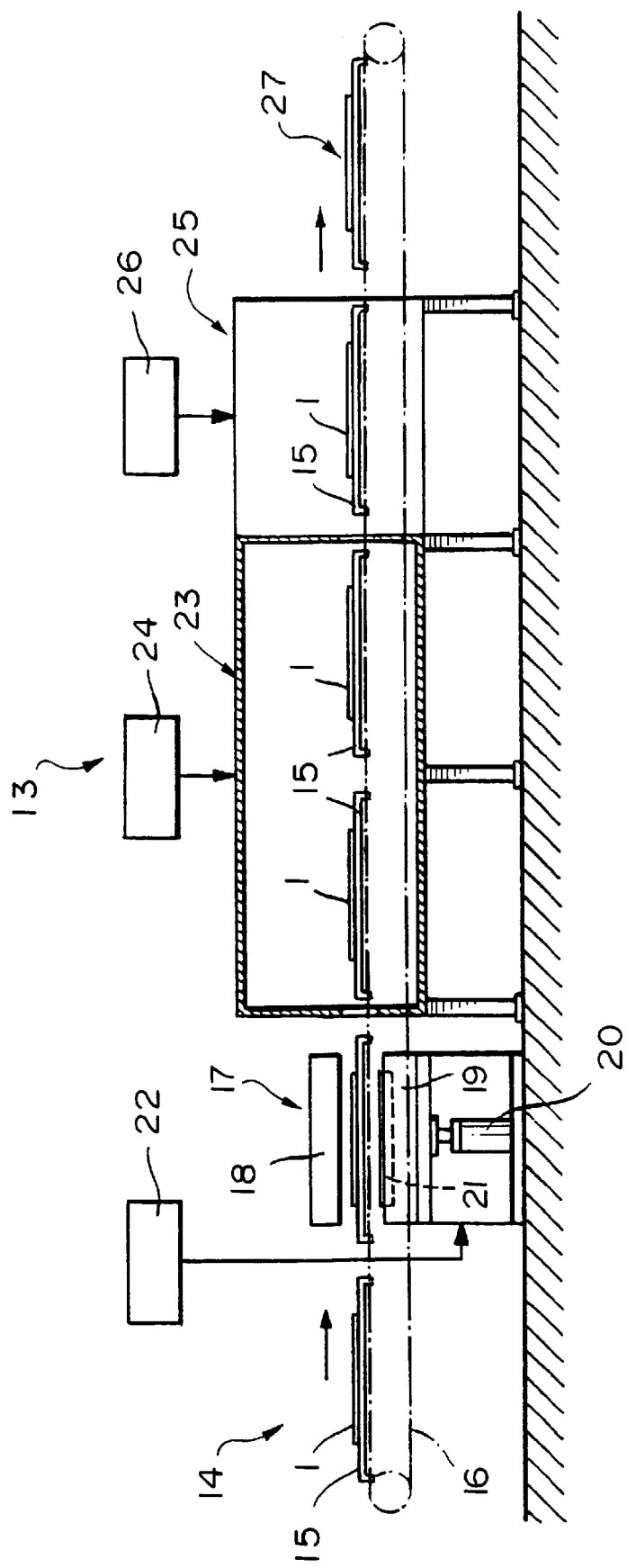
FIG. 2 shows an arrangement 13 for laminating the layers shown in FIG. 1 for manufacturing the photovoltaic module 1 according to the invention.

All variants can now be used in the laminating procedure with the help of arrangement 13 according to FIG. 2 in order to produce the photovoltaic module 1. This arrangement shows the loading station 14 at which the module stack 1 can be placed on the carrier plate 15 moved by the transport system 16, as well as the vacuum laminator 17 with the fixed upper part 18 and lower part 19 that can be raised and lowered using the hydraulic arrangement 20. Temperature, pressure and retention time are set in the vacuum laminator 17 via control system 22. In addition, FIG. 2 shows the hardening furnace 23, whose temperature is set via control system 24, the cooling area 25, whose temperature can be set via control system 26, and the removal area 27.

One variant will now be presented as an example.

The barrier layer 6 provided with the inorganic layer 7 is layered with the plastic sealing layer 4', the solar cell system 2, another plastic sealing layer 4 and the glass layer 5, as shown in FIG. 1. A PET/PVF plastic film composite can be used in place of the glass layer 5.

Further, the layer 5, in particular when used outside, must be resistant to atmospheric corrosion and decorative, so that decorative laminate sheets provided with an acrylate layer and designed MAX® EXTERIOR are suitable.

This module stack is now incorporated into the arrangement 13 for lamination according to FIG. 2. In this case, the module stack 1 is placed on the carrier plate 15 at the loading station 14, which is kept at room temperature, or a maximal temperature of 80° C.

The top and bottom side of the module stack is provided with separating films (not shown) to prevent adhesion to the carrier plate 15 and remaining system parts.

After the module stack 1 has been placed on carrier plate 15, the latter is conveyed into the vacuum laminator 17 via the transport system 16, for example a chain conveyor. The temperature of the heating plate 21 is kept at a level therein corresponding to the softening point of the plastic materials used in the sealing layer by means of an external control system 22. The hydraulic arrangement 20 presses the heating plate 21 against the carrier plate 15, so that the flow of heat inside the carrier plate brings the plastics sealing layers 4, 4' in the module stack to their softening point.

After the laminator 17 is closed, the external controller 22 applies a vacuum. The evacuation removes air and other volatile constituents from the module stack, thereby ensuring a blister-free laminate. This is followed by ventilation, which presses the flexible membrane (not shown) against the module stack.

After a defined retention time of the module stack 1 inside the vacuum laminator 17, the latter is ventilated, and the module stack is transported into the hardening furnace 23 without any additional pressing power. The latter is kept at a defined temperature therein by the control system 24, so that the sealing layers in the module stack harden after a defined retention time, and a laminate is formed that is subsequently cooled to room temperature in the cooling area 25. The hardened laminate is take off of the carrier plate in the removal area 27, and the recooled carrier plate can be routed back to the loading station 14.

The photovoltaic module 1 according to the invention can exhibit so-called thin-film solar cells instead of the crystalline silicon cells. In this case, the solar cell system can be connected with the encapsulation materials 3, 3' via press molding or calendaring. These thin-film solar cells are not susceptible to breaking, they are susceptible to water, which makes the solution proposed in the invention particularly worthwhile.

The photovoltaic module stack can have the following structure, for example:

Example e):

| Layer 5: | Glass |
|---|---|
| Solar cell system 2: | Thin-film solar cell made out of amorphous silicon |

-continued

| | |
|---|---|
| Sealing layer 4': | EVA |
| Barrier layer 6: | ETFE plastic film with inorganic SiOx oxide layer 7 |

Example f):

| | |
|---|---|
| Layer 5: | Glass |
| Solar cell system 2: | Thin-film solar cell made out of amorphous silicon |
| Sealing layer 4': | EVA |
| Barrier layer 6: | PVF/PET plastic film composite and inorganic SiOx oxide layer 7 |

In Examples e) and f), the thin-film solar cell system is protected against water vapor by the barrier layer 6. However, since the latter is not susceptible to breaking, the additional sealing layer 4 can be omitted.

COMMERCIAL APPLICABILITY

The photovoltaic modules fabricated with the procedure according to the invention are used for generating electrical energy out of sunlight. They have various applications, ranging from small power plants for emergency call boxes or mobile homes via structurally integrated roof and facade systems, to large-scale plants and solar power facilities.

Figure 4:
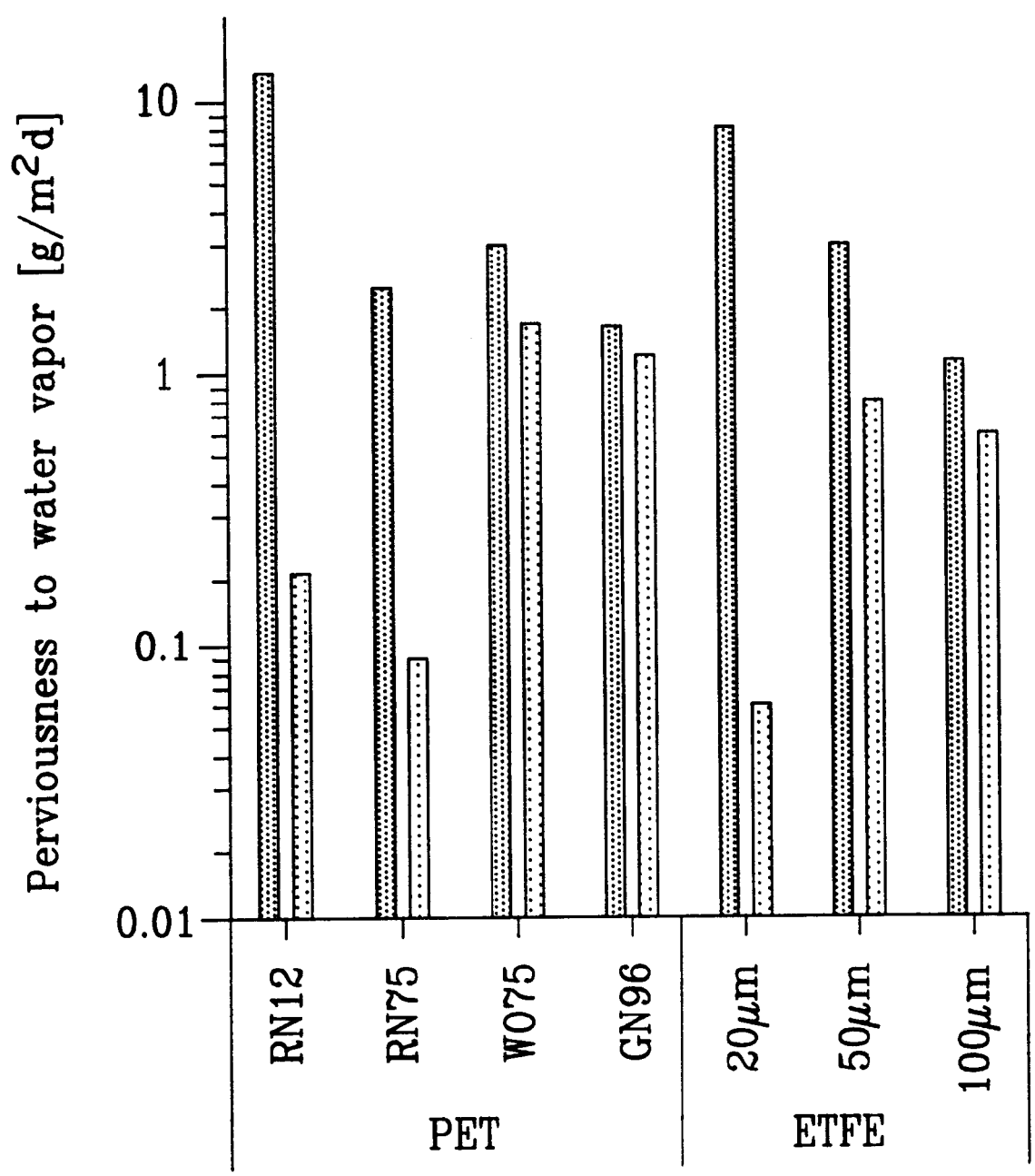
FIG. 4 shows the extent to which the photovoltaic module 1 according to the invention improves the barrier effect relative to water vapor due to the oxide layer 7 separated from the vapor phase.

With respect to outside applications, it has been shown that the barrier effect relative to water vapor is significantly improved by the oxide layer separated out of the vapor phase. FIG. 4 explains this in greater detail.

In this case, uncoated films (left column on abscissa) were compared with SiOx coated films (right column on the abscissa) with respect to their water vapor permeability in g/m2d.

As evident from this comparison, the water vapor permeability could be reduced to about one tenth the value of the uncoated material for type RN 12 PET, and to 1/25 for type RN 75. The water vapor permeability is even reduced by a factor of about 100 for ETPE with a material thickness of 20 $\mu$m.

What is claimed is:

1. A photovoltaic module in the form of a laminate, which as the core layer exhibits a solar cell system and encapsulation materials applied on both sides of the latter, wherein at least one encapsulation material layer comprises a sealing layer and a barrier layer, and that the barrier layer comprises a plastic film or a plastic film composite, which exhibits an inorganic oxide layer separated out of a vapor phase by physical vapor deposition and said sealing layer is arranged between said solar cell system and said barrier layer.

2. A photovoltaic module according to claim 1, wherein the inorganic oxide layer contains the elements aluminum or silicon, and is present in a thickness of 30 to 200 nm.

3. A photovoltaic module according to claim 1, wherein the inorganic oxide layer is permeable to light beams in the visible light wave range and near UV wavelength range, while it absorbs said beams in the UV wavelength range at shorter wavelengths.

4. A photovoltaic module according to claim 1, wherein the sealing layer consists of ethylene vinyl acetate (EVA).

5. A photovoltaic module according to claim 1, wherein the sealing layer consists of ionomers.

6. A photovoltaic module according to claim 1 wherein the plastic film on which the inorganic oxide layer is deposited consists of polyethylene terephthalate (PET) or ethylene tetrafluoroethylene copolymer (ETFE).

7. A photovoltaic module according to claim 1 wherein the inorganic oxide layer faces the solar cell system and directly contacts the adjacent sealing layer.

8. A photovoltaic module according to claim 1, wherein the inorganic oxide layer faces the solar cell system and contacts the adjacent sealing layer via a primer coat.

9. A photovoltaic module according to claim 1, wherein the inorganic oxide layer is enveloped on both sides by plastic films or composites, wherein at least one plastic film or plastic film composite acts as the barrier layer.

10. A photovoltaic module according to claim 9, wherein the inorganic oxide layer contacts the plastic films or composites via an adhesive layer and/or a hybrid layer comprised of organic/inorganic networks.

11. A photovoltaic module according to claim 1, wherein the inorganic oxide layer consists of SiOx, wherein the atomic ratio of silicon to oxygen x ranges from 1.3 to 1.7.

12. A procedure for manufacturing a photovoltaic module according to claim 1, comprising:
   a) providing a plastic film or plastic film composite with an inorganic layer separated out of the vapor phase by physical vapor deposition, laminating said plastic film or plastic film composite provided with said inorganic layer with sealing layers in order to form encapsulating materials,
   b) forming a module stack out of the solar cell system and the encapsulation materials in such a way that the sealing layers envelop the solar cell system on both sides,
   c) introducing this module stack into a loading station of an arrangement in which it is kept at a temperature below the softening point of the sealing layers,
   d) transporting the module stack to a vacuum laminator, which is evacuated, and in which the module stack is heated to the softening point of the sealing layers, and
   e) after the vacuum laminator has been ventilated without recooling, transporting the composite formed out of the module stack into a hardening furnace, in which the sealing layers are cured, so that a laminate in the form of a photovoltaic module is formed, which is removed after recooling.

* * * * *